United States Patent
Ogata et al.

(10) Patent No.: US 12,051,605 B2
(45) Date of Patent: Jul. 30, 2024

(54) SUBSTRATE PROCESSING APPARATUS

(71) Applicant: Tokyo Electron Limited, Tokyo (JP)

(72) Inventors: Nobuhiro Ogata, Kumamoto (JP);
Hiroki Sakurai, Kumamoto (JP);
Daisuke Goto, Kumamoto (JP);
Takahiro Koga, Kumamoto (JP);
Kanta Mori, Kumamoto (JP); Yusuke Hashimoto, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 253 days.

(21) Appl. No.: 17/495,833

(22) Filed: Oct. 7, 2021

(65) Prior Publication Data
US 2022/0115249 A1 Apr. 14, 2022

(30) Foreign Application Priority Data

Oct. 9, 2020 (JP) .................................. 2020-171134
Sep. 14, 2021 (JP) .................................. 2021-149079

(51) Int. Cl.
*H01L 21/67* (2006.01)
*B05B 1/14* (2006.01)

(52) U.S. Cl.
CPC ............ *H01L 21/6715* (2013.01); *B05B 1/14* (2013.01); *H01L 21/67051* (2013.01)

(58) Field of Classification Search
None
See application file for complete search history.

(56) References Cited

U.S. PATENT DOCUMENTS

| 2007/0130716 | A1* | 6/2007 | Yamada | H01L 21/67051 15/300.1 |
| 2008/0283090 | A1* | 11/2008 | DeKraker | H01L 21/31133 134/28 |
| 2010/0095981 | A1* | 4/2010 | Kamikawa | H01L 21/67028 134/3 |

FOREIGN PATENT DOCUMENTS

JP  2014-27245 A  2/2014

* cited by examiner

*Primary Examiner* — Cristi J Tate-Sims
(74) *Attorney, Agent, or Firm* — XSENSUS LLP

(57) ABSTRACT

A substrate processing apparatus includes a fluid supply unit that supplies a fluid that includes a pressurized vapor or mist of a purified water, a processing liquid supply unit that supplies a processing liquid that includes at least sulfuric acid, and a nozzle that includes a first discharge port that discharges a fluid that is supplied from the fluid supply unit, a second discharge port that discharges a processing liquid that is supplied from the processing liquid supply unit, and a guiding route that is communicated with the first discharge port and the second discharge port and guides a mixed fluid of a fluid that is discharged from the first discharge port and a processing liquid that is discharged from the second discharge port, where a cross-sectional area of the guiding route is greater than a cross-sectional area of the first discharge port.

15 Claims, 9 Drawing Sheets

SUBSTRATE PROCESSING APPARATUS

CROSS-REFERENCE TO RELATED APPLICATIONS

The present application claims the benefit of priority to Japanese Patent Application No. 2020-171134 filed on Oct. 9, 2020, the entire contents of which Japanese Patent Application are incorporated by reference in the present application, and Japanese Patent Application No. 2021-149079 filed on Sep. 14, 2021, the entire contents of which Japanese Patent Application are incorporated by reference in the present application.

FIELD

The present disclosure relates to a substrate processing apparatus.

BACKGROUND

A technique to supply a processing liquid to a substrate such as a semiconductor wafer in a manufacturing step for a semiconductor device so as to remove a removal target such as, for example, a resist film from the substrate has been known.

SUMMARY

A substrate processing apparatus according to an aspect of the present disclosure includes a substrate holding unit, a fluid supply unit, a processing liquid supply unit, and a nozzle. The substrate holding unit holds a substrate so as to be rotatable. The fluid supply unit supplies a fluid that includes a pressurized vapor or mist of a purified water. The processing liquid supply unit supplies a processing liquid that includes at least sulfuric acid. The nozzle is connected to the fluid supply unit and the processing liquid supply unit, mixes a fluid and a processing liquid, and discharge it to a substrate. Furthermore, the nozzle includes a first discharge port, a second discharge port, and a guiding route. The first discharge port discharges a fluid that is supplied from the fluid supply unit. The second discharge port discharges a processing liquid that is supplied from the processing liquid supply unit. The guiding route is communicated with the first discharge port and the second discharge port and guides a mixed fluid of a fluid that is discharged from the first discharge port and a processing liquid that is discharged from the second discharge port. Furthermore, a cross-sectional area of the guiding route is greater than a cross-sectional area of the first discharge port.

BRIEF DESCRIPTION OF DRAWING(S)

DESCRIPTION OF EMBODIMENT(S)

Figure 1:
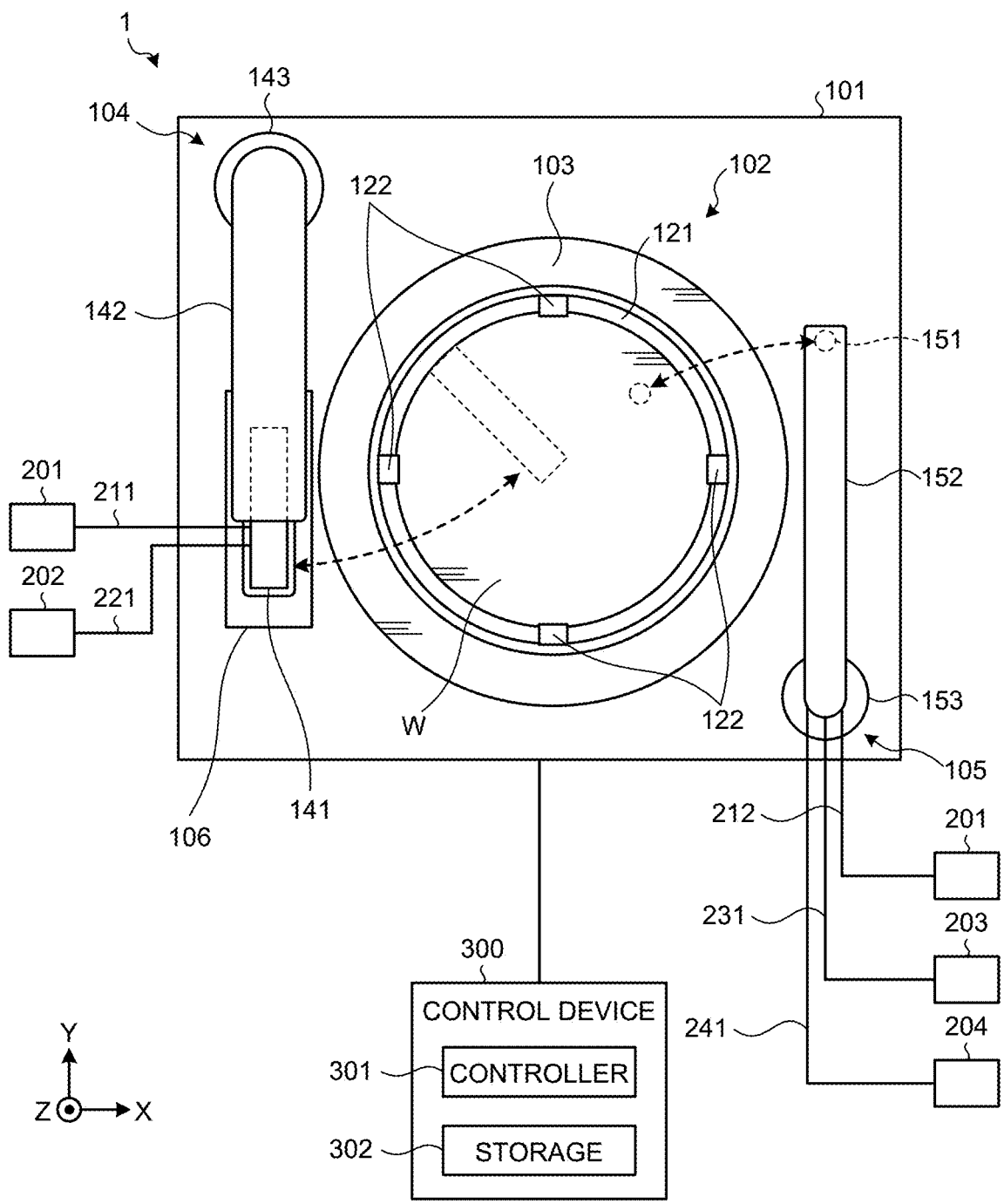
FIG. 1 is a schematic plan view of a substrate processing apparatus according to a first embodiment.

Hereinafter, a mode(s) for implementing a substrate processing apparatus according to the present disclosure (that will be described as an embodiment(s) below) will be explained in detail with reference to the drawing(s). Additionally, the present disclosure is not limited by such an embodiment(s). Furthermore, it is possible to combine respective embodiments appropriately as long as process contents thereof are not inconsistent. Furthermore, in respective embodiments as provided below, an identical site will be provided with an identical sign so as to omit a redundant explanation thereof.

Furthermore, although an expression of "constant", "orthogonal", "perpendicular", or "parallel" may be used in an embodiment(s) as illustrated below, such an expression does not need being strictly "constant", "orthogonal", "perpendicular", or "parallel". That is, each expression as described above tolerates, for example, a deviation of manufacturing accuracy, installation accuracy, or the like.

Furthermore, in each drawing that is referred to below, an orthogonal coordinate system where a direction of an X-axis, a direction of a Y-axis, and a direction of a Z-axis that are orthogonal to one another are defined and a positive direction of the Z-axis is provided as a vertically upward direction may be illustrated for a sake of clarity of an explanation. Furthermore, a direction of rotation where a vertical axis is provided as a center of rotation may be called a θ direction.

In a manufacturing step for a semiconductor device, a resist film with a predetermined pattern is formed on a processing target film that is formed on a substrate such as a semiconductor wafer, and a process of etching, ion implantation, or the like is applied to the processing target film where such a resist film is a mask thereof. After processing, an unwanted resist film is removed from a wafer.

An SPM process is used as a removing process for a resist film. An SPM process is executed by supplying, to a resist film, an SPM (Sulfuric Acid Hydrogen Peroxide Mixture) liquid at a high temperature that is obtained by mixing sulfuric acid and a hydrogen peroxide solution.

In an embodiment(s) as illustrated below, a substrate processing apparatus that is capable of improving removal efficiency of a removal target in an SPM process will be explained.

Additionally, it is also possible to apply a substrate processing apparatus according to the present disclosure to a liquid process other than an SPM process. Specifically, it is possible to apply a substrate processing apparatus according to the present disclosure to a liquid process that uses a processing liquid that includes at least sulfuric acid.

As a "processing liquid that includes at least sulfuric acid" other than an SPM liquid, for example, a processing liquid that reacts (raises a temperature thereof or increases an etchant) as it is mixed with sulfuric acid, specifically, a diluted sulfuric acid (a mixed liquid of sulfuric acid and water), a mixed liquid of sulfuric acid and an ozone water, or the like is provided. Furthermore, a "processing liquid that includes at least sulfuric acid" may be sulfuric acid.

First Embodiment

Configuration of Substrate Processing Apparatus

Figure 2:
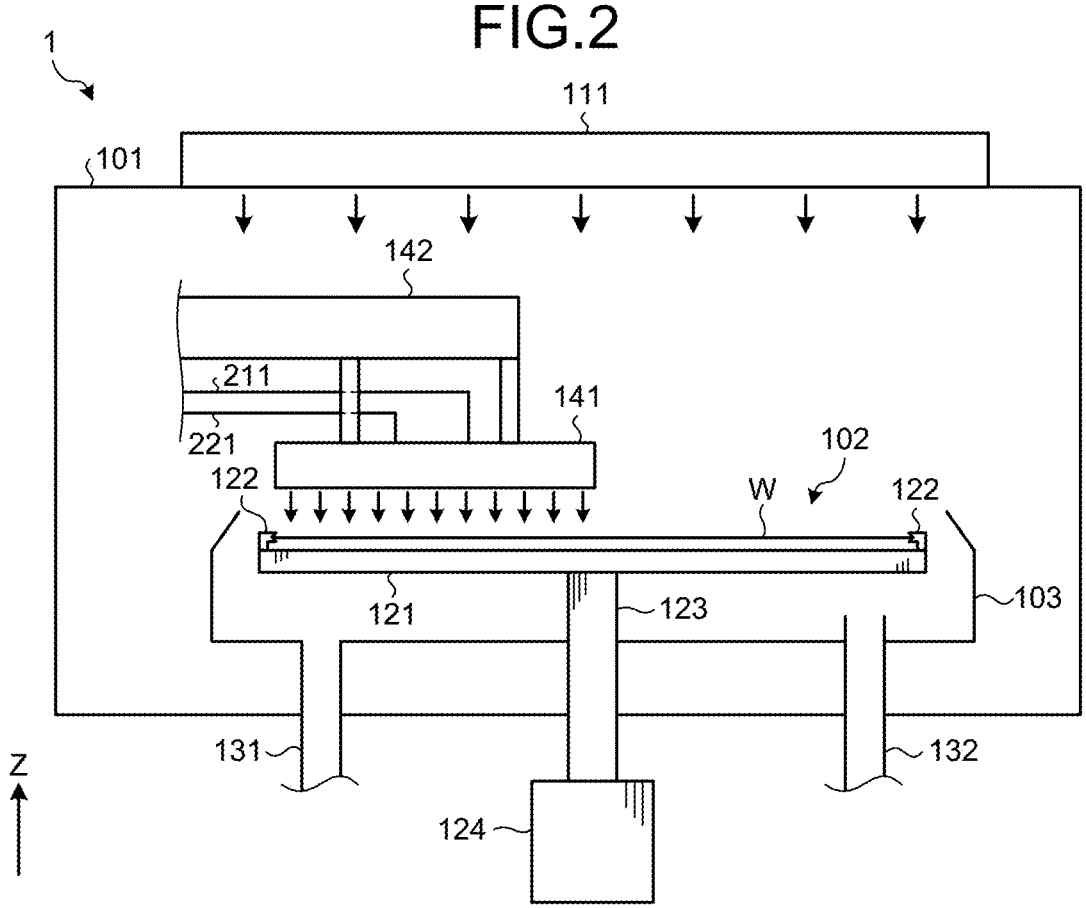
FIG. 2 is a schematic side view of a substrate processing apparatus according to a first embodiment.

First, a configuration of a substrate processing apparatus according to a first embodiment will be explained with reference to FIG. 1 and FIG. 2. FIG. 1 is a schematic plan view of a substrate processing apparatus according to a first embodiment. Furthermore, FIG. 2 is a schematic side view of a substrate processing apparatus according to a first embodiment. Additionally, FIG. 2 provides an illustration where a second supply mechanism 105 and a nozzle cleaning mechanism 106 are omitted.

As illustrated in FIG. 1 and FIG. 2, a substrate processing apparatus 1 includes a chamber 101, a substrate holding unit 102, a cup unit 103, a first supply mechanism 104, a second supply mechanism 105, and a nozzle cleaning mechanism 106. Furthermore, the substrate processing apparatus 1 includes a vapor supply unit(s) 201, an SPM supply unit 202, a rinsing liquid supply unit 203, and a replacement liquid supply unit 204. Such a substrate processing apparatus 1 removes a resist film that is formed on a surface of a substrate (that will be described as a "wafer W" below) such as a semiconductor wafer.

An SPM process has conventionally been known as a removing method for a resist film. An SPM process is executed by supplying, to a resist film, an SPM (Sulfuric Acid hydrogen Peroxide Mixture) liquid at a high temperature that is obtained by mixing sulfuric acid and a hydrogen peroxide solution.

It is possible to improve removal efficiency of a resist film by raising a temperature of an SPM liquid. As a method for raising a temperature of an SPM liquid, it is considered that, for example, a temperature of sulfuric acid is raised. However, in order to raise a temperature of sulfuric acid, a heat resistance and/or a pressure resistance of a pipe that passes sulfuric acid therethrough has/have to be enhanced where a load in an aspect of hardware is high. Furthermore, it is considered that a mixing ratio of sulfuric acid and a hydrogen peroxide solution is changed so as to increase a rate of the hydrogen peroxide solution. However, as a rate of a hydrogen peroxide solution is increased, fuming and/or bumping is/are readily caused. Furthermore, it is also considered that an SPM liquid on a wafer W is heated by an infrared heater or the like where, for example, a problem is found in an aspect of a temperature stability thereof.

Hence, in the substrate processing apparatus 1, a pressurized vapor of a purified water (a deionized water) (that will be described as a "vapor" below) is mixed with an SPM liquid. Thereby, it is possible to raise a temperature of an SPM liquid preferably.

The chamber 101 houses the substrate holding unit 102, the cup unit 103, the first supply mechanism 104, and the second supply mechanism 105. An FFU (Fun Filter Unit) 111 that forms a downflow in the chamber 101 is provided on a ceiling part of the chamber 101 (see FIG. 2).

The substrate holding unit 102 includes a body unit 121 with a diameter that is greater than that of a wafer W, a plurality of gripping units 122 that are provided on an upper surface of the body unit 121, a supporting member 123 that supports the body unit 121, and a driving unit 124 that rotates the supporting member 123. Additionally, a number of the gripping units 122 is not limited to an illustrated one.

Such a substrate holding unit 102 grips a peripheral part of a wafer W by using the plurality of gripping units 122 so as to hold the wafer W. Thereby, a wafer W is held horizontally in a state where it slightly separates from an upper surface of the body unit 121. As described above, a resist film is formed on a surface (an upper surface) of a wafer W.

Additionally, although the substrate holding unit 102 that grips a peripheral part of a wafer W by using the plurality of gripping units 122 is provided as an example herein, the substrate processing apparatus 1 may be configured to include a vacuum chuck that suctions and holds a back surface of a wafer W, instead of the substrate holding unit 102.

The cup unit 103 is arranged so as to surround the substrate holding unit 102. A drain port 131 for discharges a processing liquid that is supplied to a wafer W to an outside of the chamber 101 and an exhaust port 132 for discharging an atmosphere in the chamber 101 are formed on a bottom part of the cup unit 103.

The first supply mechanism 104 includes a nozzle 141, a first arm 142 that extends in a horizontal direction and supports the nozzle 141 from above, and a first turning/lifting mechanism 143 that turns and lifts the first arm 142. It is possible for the first arm 142 to move the nozzle 141 between a processing position above a wafer W and a waiting position outside the wafer W, by the first turning/lifting mechanism 143.

The nozzle 141 is a bar nozzle that linearly extends along a horizontal direction. The nozzle 141 has a length that is substantially identical to a radius of a wafer W. A distal part of the nozzle 141 in a longitudinal direction thereof is arranged above a central part of a wafer W and a proximal part of the nozzle 141 in a longitudinal direction thereof is arranged above a peripheral part of the wafer W, in a state where it is arranged in a processing position thereof.

The nozzle 141 is connected to a vapor supply unit 201 through a vapor supply route 211. Furthermore, the nozzle 141 is connected to the SPM supply unit 202 through an SPM supply route 221. The vapor supply unit 201 supplies a vapor that is a pressurized vapor of a purified water (a deionized water) to the nozzle 141 through the vapor supply route 211. The SPM supply unit 202 supplies an SPM liquid that is a mixed liquid of sulfuric acid and a hydrogen peroxide solution to the nozzle 141 through the SPM supply route 221. For configurations of the vapor supply unit 201 and the SPM supply unit 202, any publicly known technique may be used. For example, the SPM supply unit 202 includes a sulfuric acid supply source that supplies sulfuric acid, a hydrogen peroxide solution supply source that supplies a hydrogen peroxide solution, and a mixing unit that mixes sulfuric acid and a hydrogen peroxide solution.

The nozzle 141 mixes a vapor that is supplied from the vapor supply unit 201 and an SPM liquid that is supplied from the SPM supply unit 202 and discharges it to a wafer W. A specific configuration of the nozzle 141 will be described later.

The second supply mechanism 105 includes an auxiliary nozzle 151, a second arm 152 that extends in a horizontal direction and supports the auxiliary nozzle 151 from above, and a second turning/lifting mechanism 153 that turns and lifts the second arm 152. It is possible for the second arm 152 to move the auxiliary nozzle 151 between a processing position above a wafer W and a waiting position outside the wafer W, by the second turning/lifting mechanism 153.

The auxiliary nozzle 151 is connected to a vapor supply unit 201 through a vapor supply route 212. The vapor supply unit 201 supplies a vapor to the auxiliary nozzle 151 through the vapor supply route 212. Furthermore, the auxiliary nozzle 151 is connected to the rinsing liquid supply unit 203 through a rinsing liquid supply route 231 and is connected to the replacement liquid supply unit 204 through a replacement liquid supply route 241. The rinsing liquid supply unit 203 supplies a rinsing liquid, herein, a purified water (a deionized water) as an example thereof, to the auxiliary nozzle 151 through the rinsing liquid supply route 231. The replacement liquid supply unit 204 supplies a replacement liquid, herein, IPA (isopropyl alcohol) as an example thereof, to the auxiliary nozzle 151 through the replacement liquid supply route 241. For configurations of the rinsing liquid supply unit 203 and the replacement liquid supply unit 204, any publicly known technique may be used.

The auxiliary nozzle 151 discharges a vapor that is supplied from the vapor supply unit 201 through the vapor supply route 212 to a wafer W. Furthermore, the auxiliary nozzle 151 discharges a rinsing liquid that is supplied from the rinsing liquid supply unit 203 through the rinsing liquid supply route 231 to a wafer W. Furthermore, the auxiliary nozzle 151 discharges a replacement liquid that is supplied from the replacement liquid supply unit 204 through the replacement liquid supply route 241 to a wafer W.

The nozzle cleaning mechanism 106 is arranged at a waiting position of the nozzle 141. The nozzle cleaning mechanism 106 cleans the nozzle 141. A configuration of the nozzle cleaning mechanism 106 will be described later.

Furthermore, the substrate processing apparatus 1 includes a control device 300. The control device 300 is, for example, a computer and includes a controller 301 and a storage 302. The storage 302 stores a program that controls a variety of processes that are executed in the substrate processing apparatus 1. The controller 301 reads and executes a program that is stored in the storage 302 so as to control an operation of the substrate processing apparatus 1.

Additionally, such a program may be recorded in a computer-readable storage medium and be installed in the storage 302 of the control device 300 from such a storage medium. For a computer-readable storage medium, for example, a hard disk (HD), a flexible disk (FD), a compact disk (CD), a magnetooptical disk (MO), a memory card, or the like is provided.

Configuration of Nozzle

Figure 3:
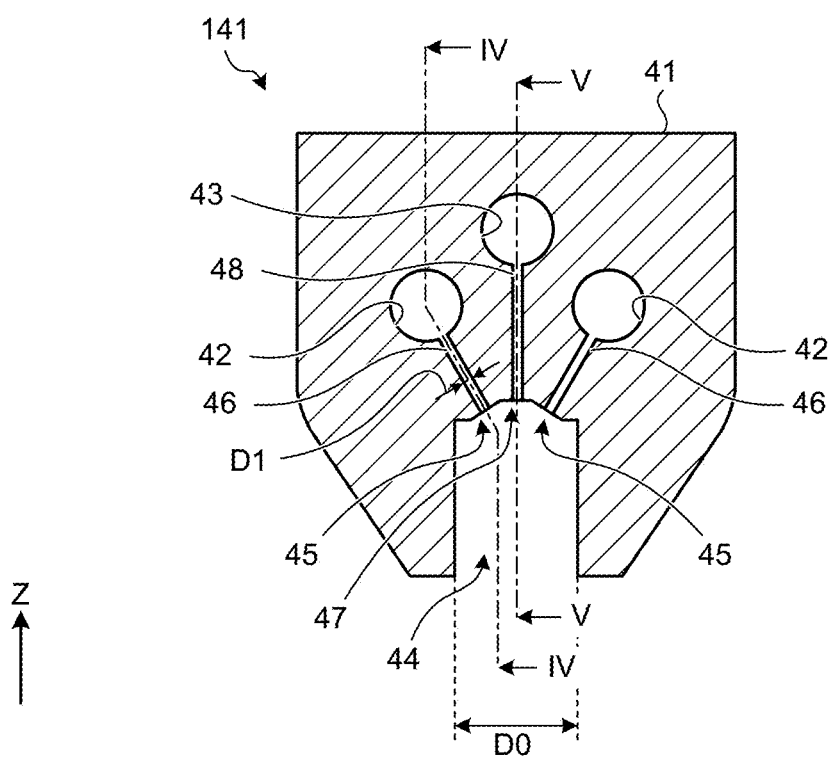
FIG. 3 is a cross-sectional view where a nozzle according to a first embodiment is cut by a plane that is orthogonal to a longitudinal direction thereof.
Figure 4:
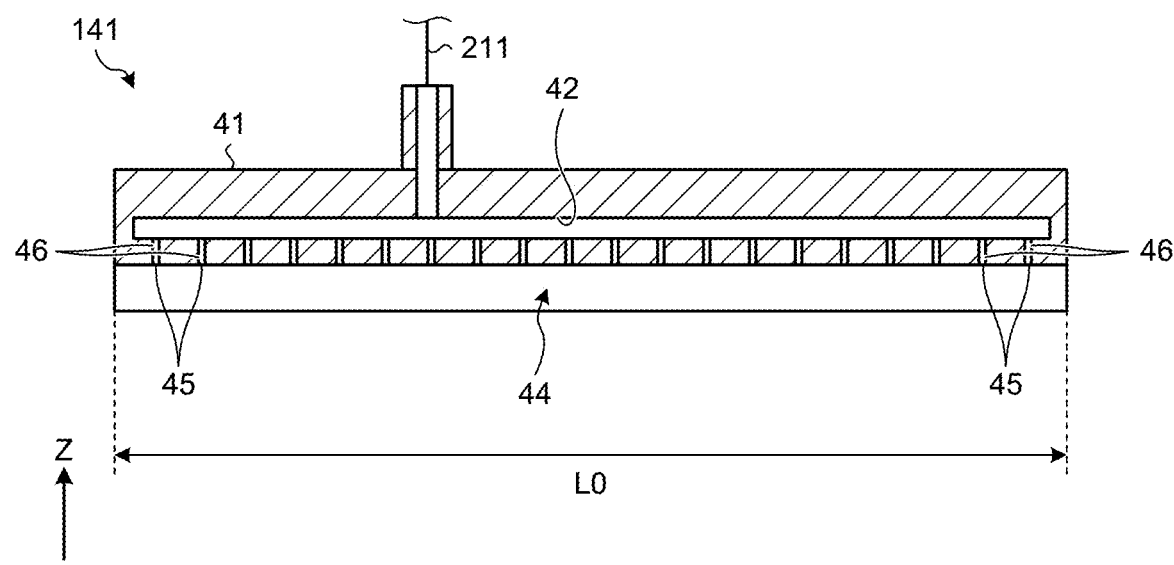
FIG. 4 is a cross-sectional view along an arrowed line IV-IV as illustrated in FIG. 3.
Figure 5:
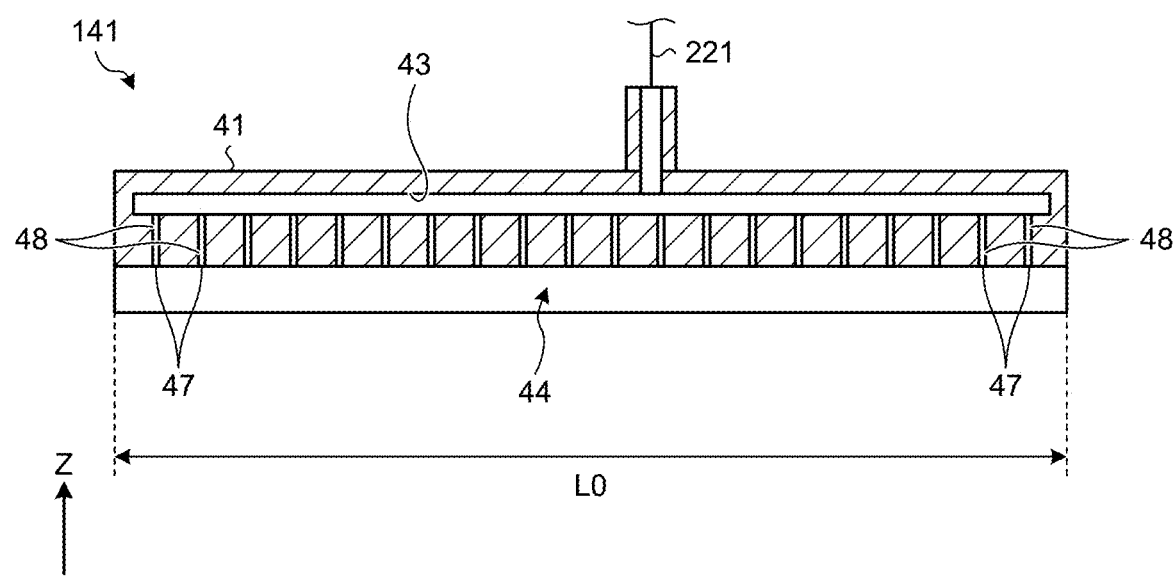
FIG. 5 is a cross-sectional view along an arrowed line V-V as illustrated in FIG. 3.
Figure 6:
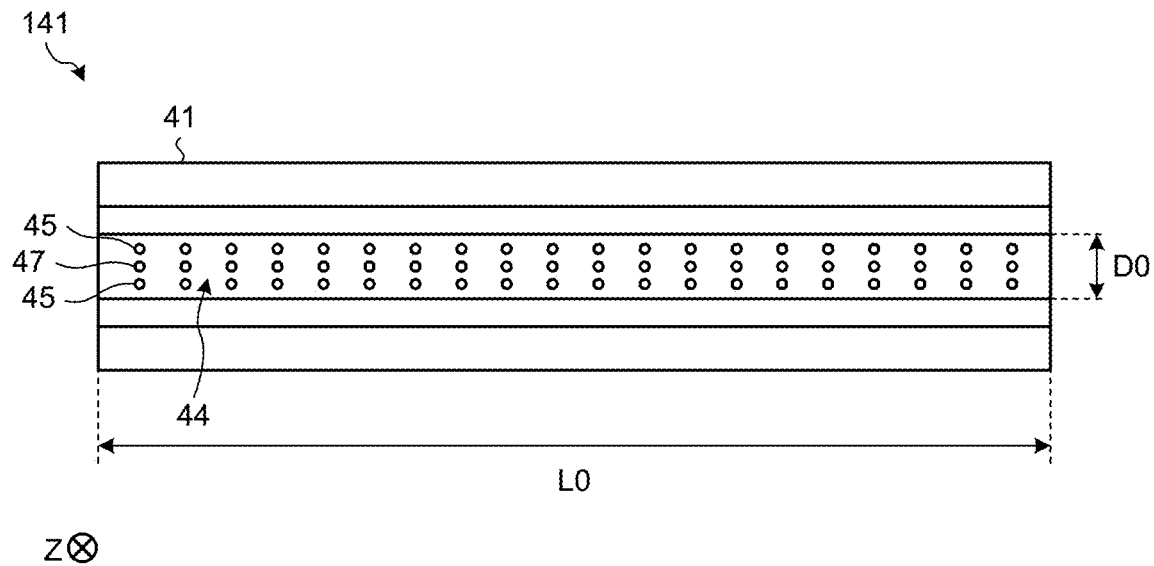
FIG. 6 is a diagram where a nozzle according to a first embodiment is viewed from below.

Next, a configuration of the nozzle 141 will be explained with reference to FIG. 3 to FIG. 6. FIG. 3 is a cross-sectional view where the nozzle 141 according to a first embodiment is cut by a plane that is orthogonal to a longitudinal direction thereof. Furthermore, FIG. 4 is a cross-sectional view along an arrowed line IV-IV as illustrated in FIG. 3. Furthermore, FIG. 5 is a cross-sectional view along an arrowed line V-V as illustrated in FIG. 3. Furthermore, FIG. 6 is a diagram where the nozzle 141 according to a first embodiment is viewed from below.

As illustrated in FIG. 3, the nozzle 141 includes a nozzle body 41, two first distribution routes 42, one second distribution route 43, and a guiding route 44. Furthermore, the nozzle 141 includes a plurality of first discharge ports 45 and a plurality of first discharge routes 46 (see FIG. 4), and a plurality of second discharge ports 47 and a plurality of second discharge routes 48 (see FIG. 5).

A first distribution route(s) 42 and the second distribution route 43 are formed inside the nozzle body 41. As illustrated in FIG. 4 and FIG. 5, the first distribution route(s) 42 and the second distribution route 43 extend along a longitudinal direction of the nozzle body 41. The first distribution route(s) 42 is/are connected to the vapor supply unit 201 through the vapor supply route 211. Furthermore, the second distribution route 43 is connected to the SPM supply unit 202 through the SPM supply route 221.

As illustrated in FIG. 3, the second distribution route 43 is arranged on a middle line (a line that divides the nozzle body 41 into left and right ones) in a cross-sectional view of the nozzle body 41. Furthermore, the two first distribution routes 42 are arranged on left and right sides of the second distribution route 43 one by one.

The guiding route 44 is positioned below the first distribution route(s) 42 and the second distribution route 43. As illustrated in FIG. 3 to FIG. 5, the guiding route 44 is a flow channel with a slit shape that is provided on a lower part of the nozzle body 41, extends along a longitudinal direction of the nozzle body 41, and also extends vertically downward. Both ends of the guiding route 44 in a longitudinal direction thereof (that is a direction that is identical to a longitudinal direction of the nozzle body 41) and a lower end thereof are opened.

The plurality of first discharge ports 45 and the plurality of second discharge ports 47 are opened on an upper end surface of the guiding route 44. As illustrated in FIG. 4 and FIG. 5, the plurality of first discharge ports 45 and the plurality of second discharge ports 47 are arrayed along a longitudinal direction of the nozzle body 41. The plurality of first discharge ports 45 and the plurality of second discharge ports 47 are arranged on a substantially whole area from one end to another end of the guiding route 44 in a longitudinal direction thereof.

The plurality of first discharge ports 45 are connected to the first distribution route(s) 42 through the plurality of first discharge routes 46. Furthermore, the plurality of second discharge ports 47 are connected to the second distribution route 43 through the plurality of second discharge routes 48.

A vapor that is supplied from the vapor supply unit 201 to the first distribution route(s) 42 is distributed from the first distribution route(s) 42 to the plurality of first discharge routes 46 and is discharged from the plurality of first discharge ports 45 to the guiding route 44. Furthermore, an SPM liquid that is supplied from the SPM supply unit 202 to the second distribution route 43 is distributed from the second distribution route 43 to the plurality of second discharge routes 48 and is discharged from the plurality of second discharge ports 47 to the guiding route 44.

A vapor that is discharged from a first discharge port(s) 45 and an SPM liquid that is discharged from a second discharge port(s) 47 are mixed near an upper end of the guiding route 44 that is an inlet thereof and are discharged from a lower end of the guiding route 44 that is an outlet thereof toward a wafer W.

If the nozzle 141 does not have the guiding route 44, a liquid drop of an SPM liquid that is discharged from the nozzle 141 may be diffused so as not to mix the SPM liquid and a vapor appropriately. Furthermore, a diffused SPM liquid may be attached to an inner wall of the chamber 101 so as to contaminate the chamber 101 and/or a wafer W in the chamber 101.

On the other hand, the nozzle 141 according to a first embodiment includes the guiding route 44, so that it is possible to prevent or reduce diffusing of an SPM liquid without mutually contacting a vapor that is discharged from the first discharge port(s) 45. Hence, it is possible for the nozzle 141 to mix a vapor and an SPM liquid efficiently. Therefore, it is possible for the nozzle 141 according to an embodiment to raise a temperature of an SPM liquid so as to be higher, as compared with, for example, a nozzle that does not include the guiding route 44. Furthermore, it is possible to prevent or reduce contamination of an inside of the chamber 101 that is caused by diffusion of an SPM liquid.

Furthermore, as illustrated in FIG. 6, a cross-sectional area of the guiding route 44 is greater than a cross-sectional area(s) of a first discharge port(s) 45. For example, a cross-sectional area of the guiding route 44 is synonymous with an opening area of a lower end of the guiding route 44 where, when a width and a length of the guiding route 44 are denoted by D0 and L0, it is possible to represent it with D0×L0. Furthermore, a cross-sectional area of a first discharge port 45 is synonymous with an opening area of the first discharge port 45 where, when a diameter of the first discharge port 45 is denoted by D1, it is possible to represent it with $(D1/2)^2 \times \pi$. A cross-sectional area(s) of the first discharge port(s) 45 as referred to herein may be a total of cross-sectional areas of the plurality of first discharge ports 45 that are included in the nozzle 141. Additionally, a cross-sectional area of the guiding route 44 is greater than a total of cross-sectional areas of the plurality of first discharge ports 45 and cross-sectional areas of the plurality of second discharge ports 47.

As a cross-sectional area of the guiding route 44 is excessively large, a speed of a liquid drop of an SPM liquid that passes through the guiding route 44 is decreased, so that liquid drops of an SPM liquid that move along an inner wall of the guiding route 44 are readily aggregated mutually so as to provide a large drop thereof. On the other hand, as a cross-sectional area of the guiding route 44 is excessively small, a flow volume of a vapor in the guiding route 44 is limited so as to be small, so that no preferable formation of a liquid drop of an SPM liquid near an inlet of the guiding route 44 may be executed so as to provide a formed liquid drop that is a drop that is larger than a desirable drop diameter. Therefore, it is desirable to form the guiding route 44 with a cross-sectional area that is an appropriate size so that it is possible to discharge a liquid drop of an SPM liquid in a sufficiently atomized state thereof to a wafer W.

Hence, the nozzle 141 according to a first embodiment is formed in such a manner that a cross-sectional area of the guiding route 44 is greater than a cross-sectional area(s) of the first discharge port(s) 45 as described above. As it is thus formed, it is possible to atomize a liquid drop of an SPM liquid appropriately.

Configuration of Nozzle Cleaning Mechanism

Figure 7:
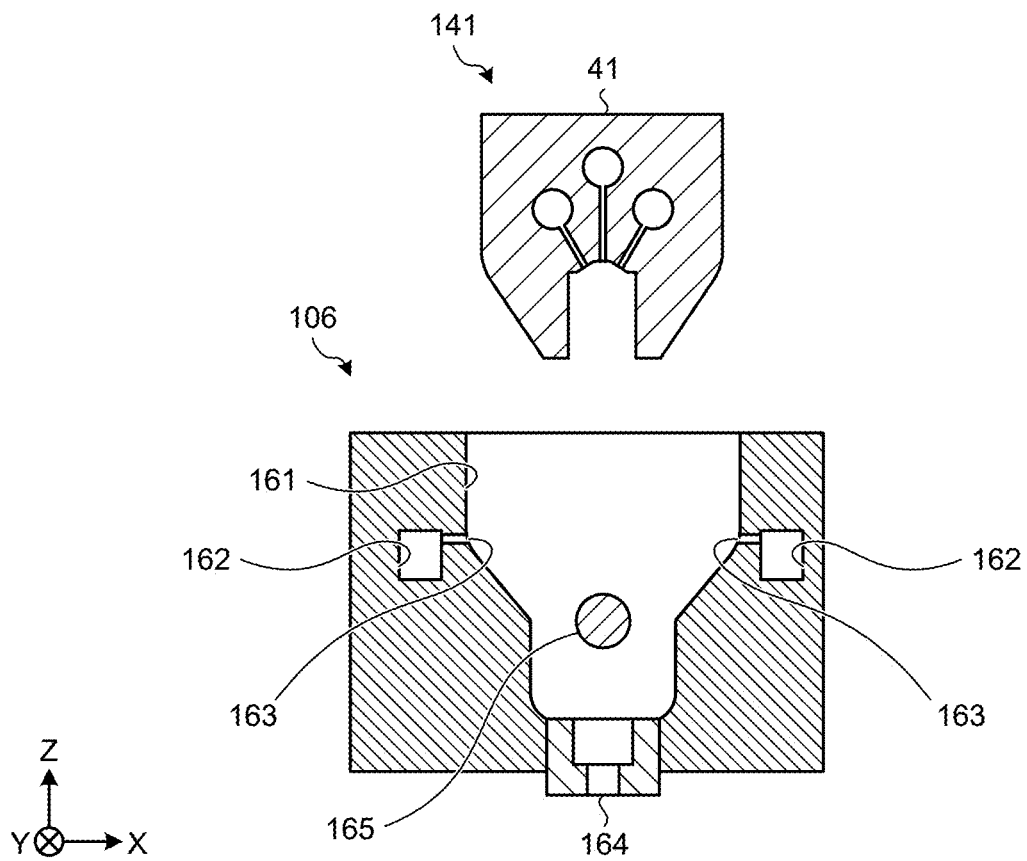
FIG. 7 is a cross-sectional view where a nozzle cleaning mechanism according to a first embodiment is cut by a plane that is orthogonal to a longitudinal direction thereof.

Next, a configuration of the nozzle cleaning mechanism 106 will be explained with reference to FIG. 7. FIG. 7 is a cross-sectional view where the nozzle cleaning mechanism 106 according to a first embodiment is cut by a plane that is orthogonal to a longitudinal direction thereof.

As illustrated in FIG. 7, the nozzle cleaning mechanism 106 includes a cleaning tank 161, two cleaning liquid supply routes 162, a plurality of cleaning liquid discharge ports 163, and a discharge port 164. Furthermore, the nozzle cleaning mechanism 106 includes a dew removing member 165.

The cleaning tank 161 is formed into an elongated shape so as to fit an outline of the nozzle body 41. The cleaning tank 161 is capable of housing the nozzle 141. A cleaning liquid supply route(s) 162 is/are formed inside the nozzle cleaning mechanism 106 and extend(s) along a longitudinal direction of the cleaning tank 161 (a direction of a Y-axis). The cleaning liquid supply route(s) 162 is/are connected to a non-illustrated cleaning liquid supply source and causes a cleaning liquid that is supplied from such a cleaning liquid supply source to flow therethrough. A cleaning liquid is, for example, a purified water (a deionized water). The two cleaning liquid supply routes 162 are arranged on left and right sides of the cleaning tank 161 one by one.

The plurality of cleaning liquid discharge ports 163 are opened on an inner wall surface of the cleaning tank 161. The plurality of cleaning liquid discharge ports 163 are arrayed along a longitudinal direction of the cleaning tank 161. The plurality of cleaning liquid discharge ports 163 are communicated with the cleaning liquid supply routes 162 and discharge a cleaning liquid that flows through the cleaning liquid supply routes 162 to an inside of the cleaning tank 161. The discharge port 164 is provided on a bottom part of the cleaning tank 161 and discharges a cleaning liquid from the cleaning tank 161.

The dew removing member 165 is arranged inside the cleaning tank 161. The dew removing member 165 is a member with an elongated shape that extends along a longitudinal direction of the cleaning tank 161. The dew removing member 165 is formed of a member with a hydrophilicity that is higher than that of the nozzle body 41 of the nozzle 141. For example, whereas the nozzle body 41 is formed of a resin, the dew removing member 165 is formed of quartz. Although a cross-sectional shape of the dew removing member 165 is a circular shape in an illustrated example, a cross-sectional shape of the dew removing member 165 does not have to be a circular shape.

Additionally, the nozzle cleaning mechanism 106 includes an (non-illustrated) overflow line for discharging a cleaning liquid that exceeds a certain amount from the cleaning tank 161 in a case where a certain amount of a cleaning liquid is stored in the cleaning tank 161. An overflow line is provided, for example, below the plurality of cleaning liquid discharge ports 163.

Figure 8:
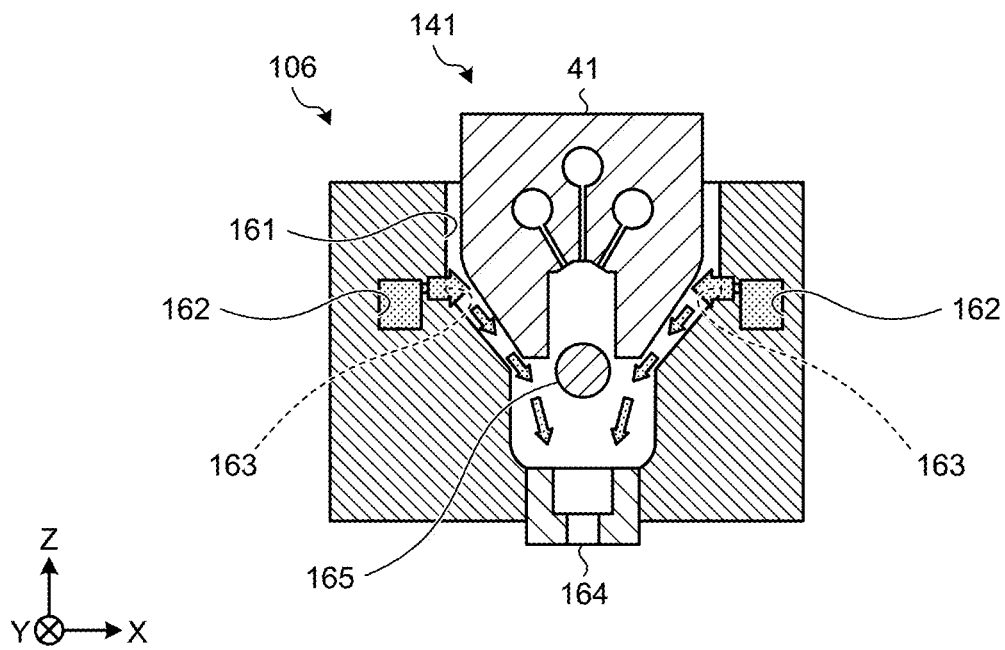
FIG. 8 is an explanatory diagram of an operation of a nozzle cleaning process according to a first embodiment.
Figure 9:
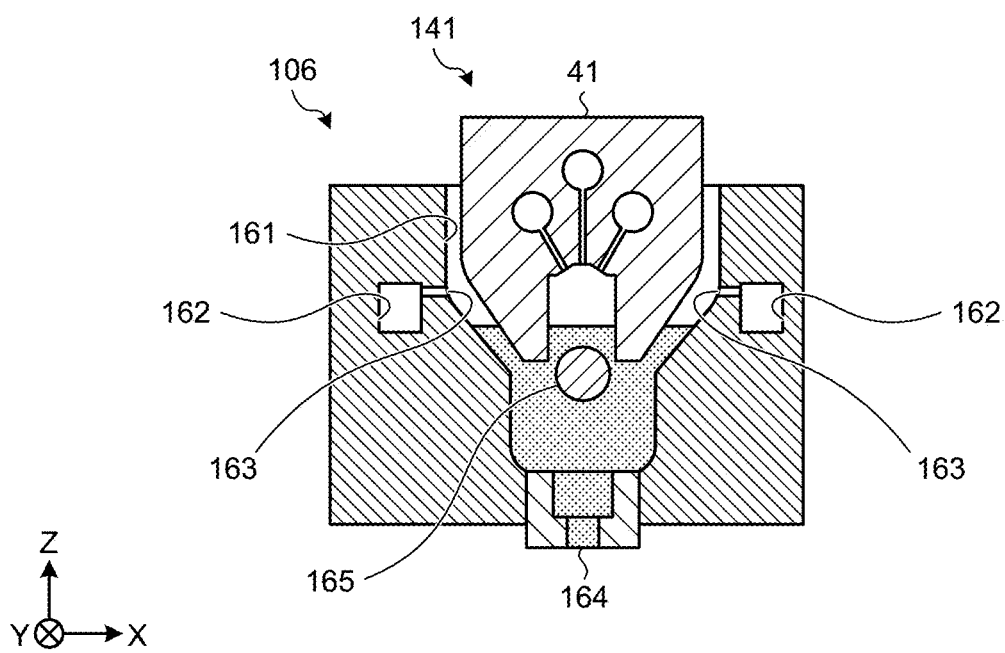
FIG. 9 is an explanatory diagram of an operation of a nozzle cleaning process according to a first embodiment.
Figure 10:
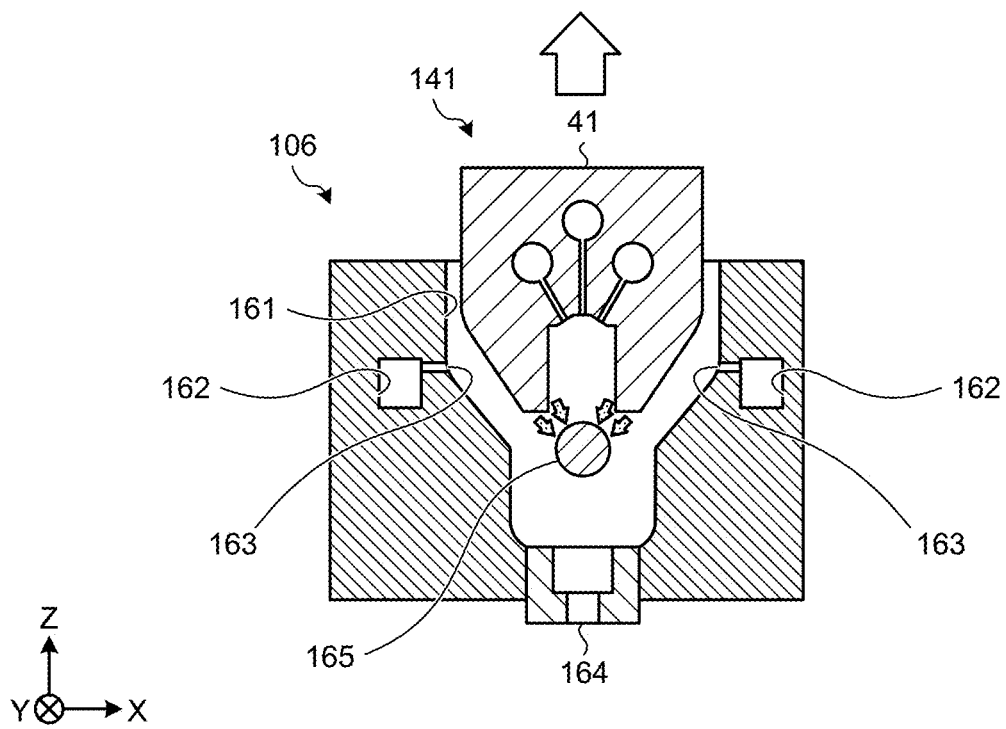
FIG. 10 is an explanatory diagram of an operation of a nozzle cleaning process according to a first embodiment.

Then, a cleaning process for the nozzle 141 that uses such a nozzle cleaning mechanism 106 will be explained with reference to FIG. 8 to FIG. 10. FIG. 8 to FIG. 10 are explanatory diagrams of an operation of a nozzle cleaning process according to a first embodiment. A nozzle cleaning process as illustrated in FIG. 8 to FIG. 10 is executed according to control that is executed by the controller 301 (see FIG. 1).

As illustrated in FIG. 8, the controller 301 first moves the nozzle 141 to an inside of the cleaning tank 161. Thereby, the nozzle 141 is arranged in the cleaning tank 161 of the nozzle cleaning mechanism 106. Herein, the nozzle 141 is arranged at a position that is close to the dew removing member 165 so as not to contact it.

Then, the controller 301 discharges a cleaning liquid from the plurality of cleaning liquid discharge ports 163. A cleaning liquid is discharged to a side surface of the nozzle body 41 that is arranged in the cleaning tank 161 and subsequently flows downward along a gap between the side surface of the nozzle body 41 and an inner surface of the cleaning tank 161.

As supply of a cleaning liquid is continued, the cleaning liquid is stored in the cleaning tank 161 as illustrated in FIG. 9. Thereby, at least a part that includes a lower part of the nozzle body 41 is dipped in a cleaning liquid. Additionally, a cleaning liquid that exceeds a certain amount is discharged from a non-illustrated overflow line.

Thus, the nozzle cleaning mechanism 106 discharges a cleaning liquid from the plurality of cleaning liquid discharge ports 163 toward a side surface of the nozzle body 41, and further, the nozzle 141 is dipped in the cleaning liquid that is stored in the cleaning tank 161, so that it is possible to clean the nozzle 141. Specifically, it is possible to remove an SPM liquid that is attached to the nozzle 141.

Then, the controller 301 lifts the nozzle 141. Herein, a cleaning liquid that is attached to the nozzle 141 is collected below the nozzle 141 by gravity. Then, a cleaning liquid that is attached to the nozzle 141 moves to the dew removing member 165 with a hydrophilicity that is higher than that of the nozzle 141. Thereby, a cleaning liquid is removed from the nozzle 141, so that the nozzle 141 is dried.

The nozzle 141 according to a first embodiment includes the guiding route 44, so that a structure thereof is complicated as compared with a nozzle that does not include the guiding route 44. Hence, in a case where the nozzle 141 is dried by using a gas such as an $N_2$ (nitrogen) gas, it is preferable to increase a flow volume of a discharged gas. However, as a flow volume of a discharged gas is increased, an internal pressure of the chamber 101 may be changed so as to affect a process for a wafer W. On the other hand, the nozzle cleaning mechanism 106 according to a first embodiment includes the dew removing member 165 with a hydrophilicity that is higher than that of the nozzle 141, so that it is possible to dry the nozzle 141 without using a gas. That is, the dew removing member 165 moves, from the nozzle 141 to the dew removing member 165, a liquid drop of a cleaning liquid that is interposed between the nozzle 141 and the dew removing member 165 and contacts both the nozzle 141 and the dew removing member 165.

Therefore, it is possible for the nozzle cleaning mechanism 106 according to a first embodiment to dry the nozzle 141 without affecting a process for a wafer W.

Specific Operation of Substrate Processing Apparatus

Figure 11:
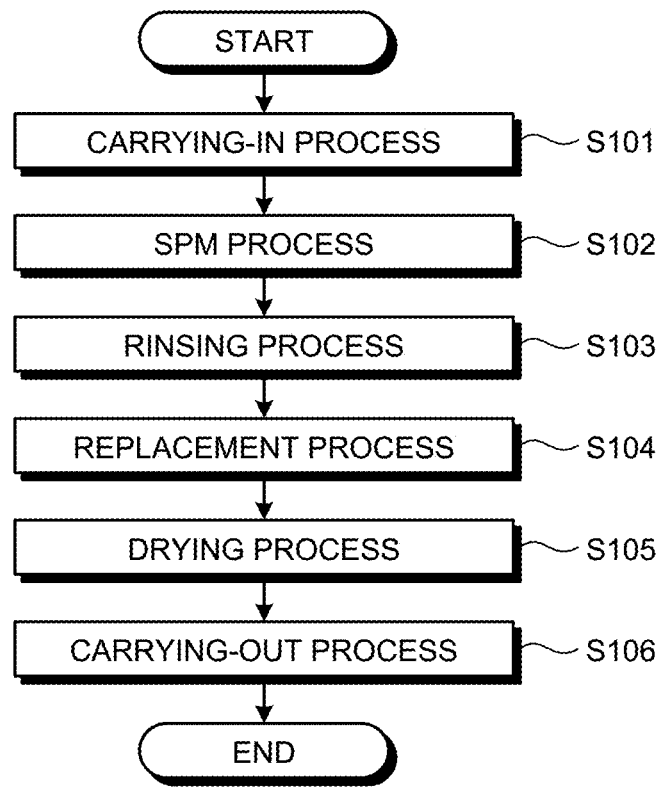
FIG. 11 is a flowchart that illustrates a procedure of a process that is executed by a substrate processing apparatus according to a first embodiment.

Next, a specific operation of the substrate processing apparatus 1 will be explained with reference to FIG. 11. FIG. 11 is a flowchart that illustrates a procedure of a process that is executed by the substrate processing apparatus 1 according to a first embodiment. A series of processes as illustrated in FIG. 11 is executed according to control that is executed by the controller 301.

First, the substrate processing apparatus 1 executes a carrying-in process for a wafer W (step S101). Specifically, a wafer W is carried in the chamber 101 (see FIG. 1) of the substrate processing apparatus 1 by a substrate transfer device that is arranged outside the substrate processing apparatus 1 and is held by the substrate holding unit 102. Subsequently, the substrate processing apparatus 1 rotates the substrate holding unit 102 at a predetermined speed of rotation.

Then, the substrate processing apparatus 1 executes an SPM process (step S102). First, the first turning/lifting mechanism 143 moves the nozzle 141 from a waiting position to a processing position on a wafer W. Subsequently, a mixed fluid of a vapor and an SPM liquid is discharged from the nozzle 141 to a surface of a wafer W. Thereby, a resist film that is formed on a surface of a wafer W is removed.

Additionally, the substrate processing apparatus 1 may use the auxiliary nozzle 151 in an SPM process. In a case where the auxiliary nozzle 151 is used, the second turning/lifting mechanism 153 positions the auxiliary nozzle 151 above a wafer W. Specifically, the auxiliary nozzle 151 is arranged at a place where supply of a vapor may be insufficient in a case of only the nozzle 141, for example, on an outer peripheral part of a wafer W. Subsequently, a vapor is discharged from the auxiliary nozzle 151 to a surface of a wafer W.

As the auxiliary nozzle 151 is thus used, it is possible to supply a vapor to a whole surface of a wafer W more uniformly. Therefore, it is possible to raise a temperature of an SPM liquid over a whole surface of a wafer W more uniformly.

As an SPM process at step S102 is ended, the substrate processing apparatus 1 executes a rinsing process (step S103). In such a rinsing process, a rinsing liquid (a purified water) is supplied from the auxiliary nozzle 151 to a surface of a wafer W. A rinsing liquid that is supplied to a wafer W is applied to and spread on a surface of the wafer W by centrifugal force that is involved with rotation of the wafer W. Thereby, an SPM liquid that remains on a wafer W is rinsed with a rinsing liquid.

Then, the substrate processing apparatus 1 executes a replacement process (step S104). In a replacement process, a replacement liquid (IPA) is supplied from the auxiliary nozzle 151 to a surface of a wafer W. A replacement liquid that is supplied to a wafer W is applied to and spread on a surface of the wafer W by centrifugal force that is involved with rotation of the wafer W. Thereby, a rinsing liquid that remains on a wafer W is replaced with a replacement liquid.

Then, the substrate processing apparatus 1 executes a drying process (step S105). Such a drying process increases a rotational frequency of a wafer W. Thereby, a replacement liquid that remains on a wafer W is shaken off, so that the wafer W is dried. Subsequently, rotation of a wafer W is stopped.

Then, the substrate processing apparatus 1 executes a carrying-out process (step S106). In a carrying-out process, a wafer W that is held by the substrate holding unit 102 is delivered to an external substrate transfer device. As such a carrying-out process is completed, substrate processing for one wafer W is completed.

Additionally, it is sufficient that a nozzle cleaning process as described above is executed after an SPM process for a certain wafer W is ended and is completed until an SPM process for a next wafer W is started.

Second Embodiment

Figure 12:
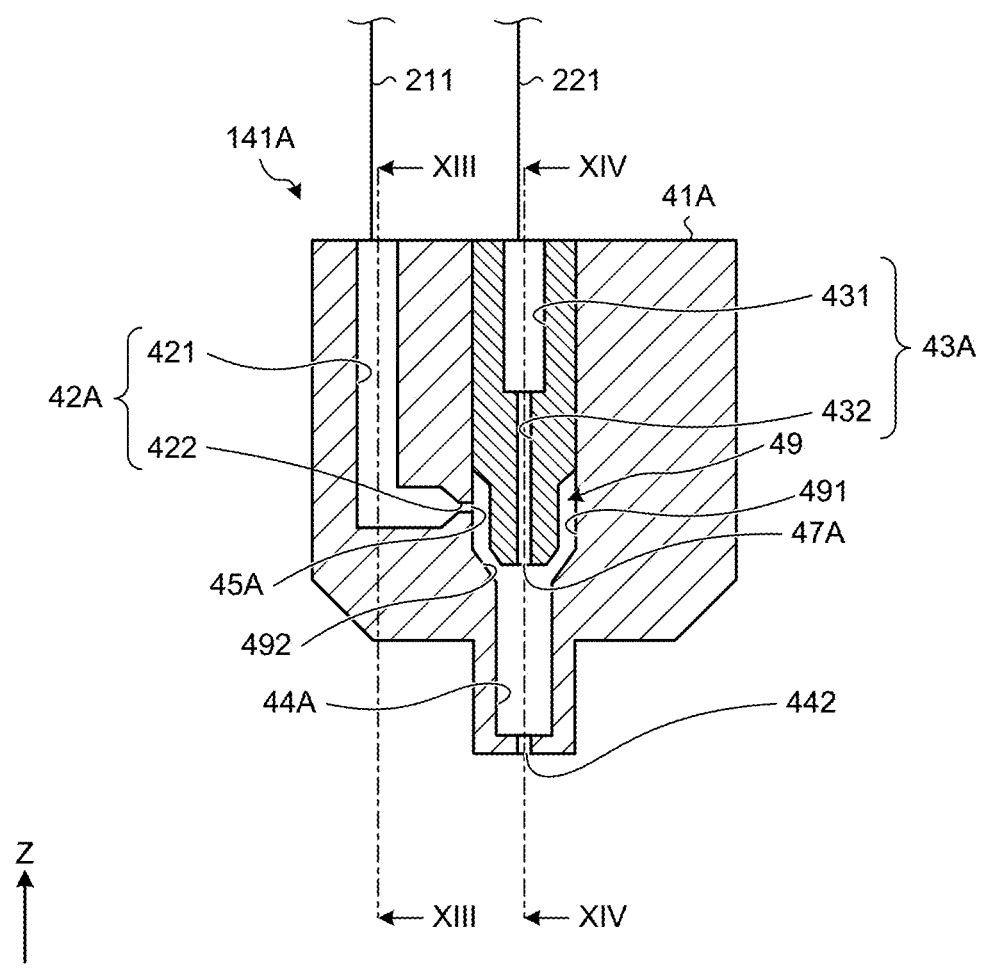
FIG. 12 is a cross-sectional view where a nozzle according to a second embodiment is cut by a plane that is orthogonal to a longitudinal direction thereof.
Figure 13:
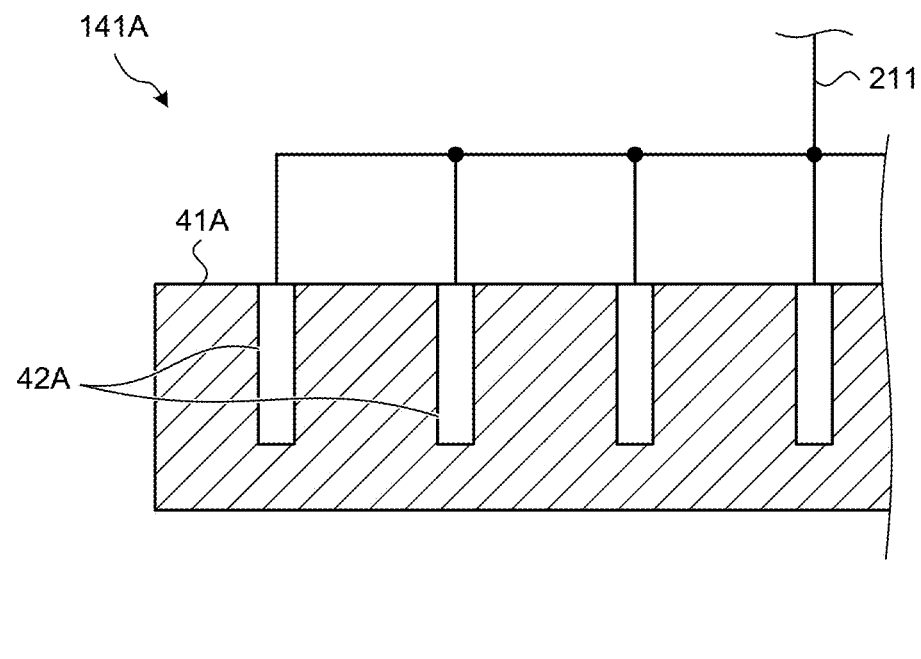
FIG. 13 is a cross-sectional view along an arrowed line XIII-XIII as illustrated in FIG. 12.
Figure 14:
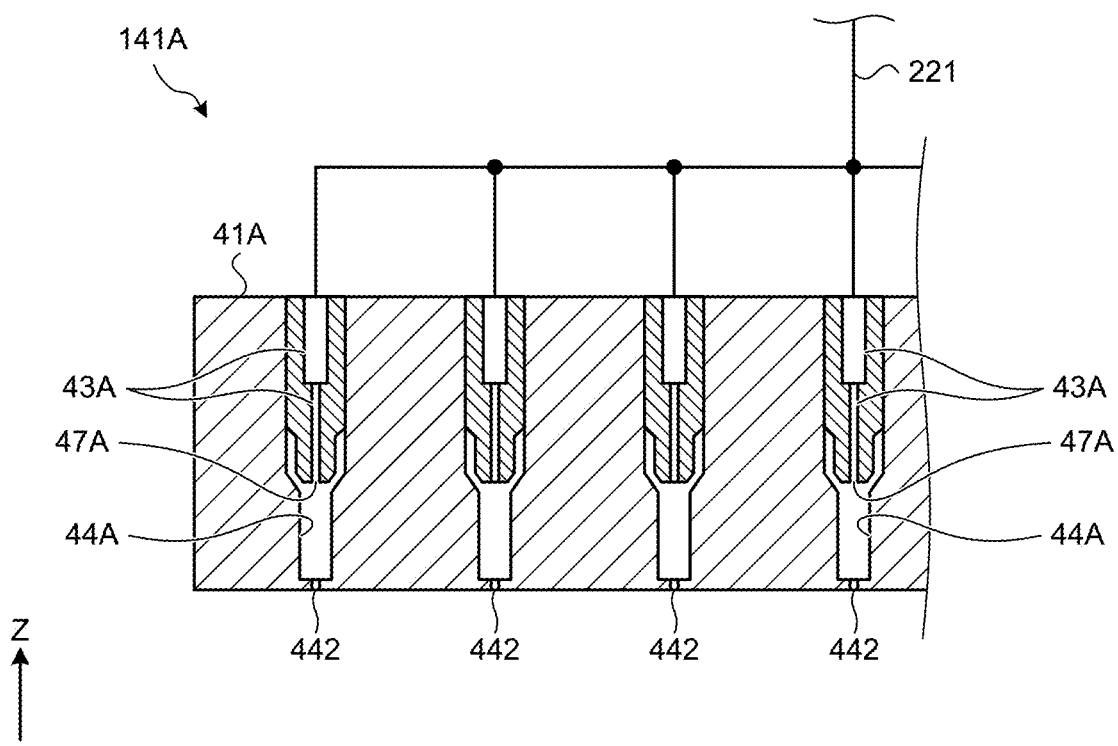
FIG. 14 is a cross-sectional view along an arrowed line XIV-XIV as illustrated in FIG. 12.

Next, a configuration of a nozzle according to a second embodiment will be explained with reference to FIG. 12 to FIG. 14. FIG. 12 is a cross-sectional view where a nozzle according to a second embodiment is cut by a plane that is orthogonal to a longitudinal direction thereof. Furthermore, FIG. 13 is a cross-sectional view along an arrowed line XIII-XIII as illustrated in FIG. 12. FIG. 14 is a cross-sectional view along an arrowed line XIV-XIV as illustrated in FIG. 12.

As illustrated in FIG. 12, a nozzle 141A according to a second embodiment is a so-called internal mixing type two-fluid nozzle. The nozzle 141A includes a nozzle body 41A with an elongated shape, a plurality of first supply routes 42A (see FIG. 13), a plurality of second supply routes 43A (see FIG. 14), and a plurality of guiding routes 44A (see FIG. 14). Furthermore, the nozzle 141A includes a plurality of first discharge ports 45A (see FIG. 13) and a plurality of second discharge ports 47A (see FIG. 14).

A second supply route(s) 43A supplies/supply an SPM liquid to an inside of the nozzle body 41A. The second supply route(s) 43A and a guiding route(s) 44A extend in a vertical direction and are arranged coaxially. A second supply route 43A includes an introduction unit 431 and a narrowing unit 432. The introduction unit 431 corresponds to a flow channel on an upstream side of the second supply route 43A and the narrowing unit 432 corresponds to a flow channel on a downstream side of the second supply route 43A. Furthermore, the narrowing unit 432 is formed in such a manner that a cross-sectional area (a diameter) thereof is less than that of the introduction unit 431.

An outlet of the narrowing unit 432 is arranged so as to be close to an inlet of the guiding route 44A. Additionally, it is preferable that a cross-sectional area of the narrowing unit 432 is constant from an inlet to an outlet thereof, and it is preferable that a cross-sectional shape of the narrowing unit 432 is, for example, a circular shape, an elliptical shape, or the like. As illustrated in the figure(s), in a case where a cross-sectional area of the narrowing unit 432 is constant from an inlet to an outlet thereof, a cross-sectional area (a diameter) of a second discharge port 47A that is an outlet of the second supply route 43A is equal to a cross-sectional area (a diameter) of the narrowing unit 432.

An introduction space 49 is formed in such a manner that it is shaped into a ring shape so as to surround the narrowing unit 432 around the second supply route 43A.

A first supply route(s) 42A supplies/supply a vapor to an inside of the nozzle body 41A. Specifically, a first discharge port 45A that is an outlet of a first supply route 42A is connected to the introduction space 49 and supplies a vapor to the introduction space 49.

The second supply route(s) 43A is/are arranged so as to pass through an inside of the introduction space 49. Such an introduction space 49 is formed into a cylindrical shape that has a cross-sectional shape that is a ring shape. A ring shape part 491 and a taper part 492 with a diameter that is decreased downward are formed in the introduction space 49. The taper part 492 is formed on a downstream side of the ring shape part 491 and an outlet of the taper part 492 is opened in a ring shape between an outlet of the narrowing unit 432 of the second supply route 43A and an inlet of a guiding route 44A. Therefore, a vapor that is introduced into the introduction space 49 is mixed with an SPM liquid that is supplied from the narrowing unit 432 of the second supply route 43A near an inlet of the guiding route 44A, and thereby, a mixed fluid of the SPM liquid (a liquid drop of the SPM liquid) is formed.

The first discharge port 45A that is an outlet of the first supply route 42A is opened on an inner wall surface of the ring shape part 491 in the introduction space 49. The first supply route 42A includes an introduction unit 421 and a narrowing unit 422. The introduction unit 421 corresponds to a flow channel on an upstream side of the first supply route 42A and the narrowing unit 422 corresponds to a flow channel on a downstream side of the first supply route 42A. Furthermore, the narrowing unit 422 is formed in such a manner that a cross-sectional area (a diameter) thereof is less than that of the introduction unit 421. An outlet of the narrowing unit 422 corresponds to the first discharge port 45A and is opened on an inner surface of the ring shape part 491. It is preferable that a cross-sectional area of the narrowing unit 422 is constant from an inlet to an outlet thereof, and it is preferable that a cross-sectional shape of the narrowing unit 422 is, for example, a circular shape, an elliptical shape, or the like. As illustrated in the figure(s), in a case where a cross-sectional area of the narrowing unit 422 is constant from an inlet to an outlet thereof, a cross-sectional area (a diameter) of the first discharge port 45A that is an outlet of the second supply route 43A is equal to a cross-sectional area (a diameter) of the narrowing unit 422.

The guiding route(s) 44A is/are arranged coaxially with the second supply route(s) 43A as described previously and is/are communicated with the second supply route(s) 43A and the introduction space 49. It is preferable that the guiding route 44A is formed linearly and a cross-sectional area (a diameter) of the guiding route 44A is constant from an inlet to an outlet thereof, and it is preferable that a cross-sectional shape of the guiding route 44A is, for example, a circular shape, an elliptical shape, or the like.

A vapor that is introduced from the first supply route(s) 42A through the introduction space 49 and an SPM liquid that is introduced from the second supply route(s) 43A are mixed near an inlet(s) of the guiding route(s) 44A. Thereby, numerous liquid drops of an SPM liquid are formed and formed liquid drops, together with a vapor, are guided to an outside through the guiding route(s) 44A.

A plurality of injection ports 442 are provided at tips of the guiding routes 44A. An injection port 442 is formed into an orifice shape with a cross-sectional area that is less than that of the guiding route 44A. In a case where such an injection port 442 with an orifice shape with a cross-sectional area that is less than that of the guiding route 44A is absent, a liquid drop that is grown along an inner wall of the guiding route 44A is discharged directly. It is preferable that a cross-sectional area of the injection port 442 is constant from an inlet to an outlet thereof, and it is preferable that a cross-sectional shape of the injection port 442 is, for example, a circular shape, an elliptical shape, or the like. A liquid drop that passes through an inside of the guiding route 44A is atomized again while passing through an inside of the injection port 442 and is injected. Therefore, even in a case where a liquid drop is significantly grown while moving along an inner wall of the guiding route 44A, it is possible to atomize a liquid drop so as to have a sufficiently small particle diameter and inject it by passing through the injection port 442.

As illustrated in FIG. 13, the plurality of first supply routes 42A are arrayed along a longitudinal direction of the nozzle body 41A. The first supply routes 42A are connected to the vapor supply unit 201 through the vapor supply route 211. Furthermore, as illustrated in FIG. 14, the plurality of second supply routes 43A are also arrayed along a longitudinal direction of the nozzle body 41A similarly. The second supply routes 43A are connected to the SPM supply unit 202 through the SPM supply route 221.

As illustrated in FIG. 12 to FIG. 14, the nozzle 141A according to a second embodiment includes the plurality of first discharge ports 45A and the plurality of second discharge ports 47A and includes the plurality of guiding routes 44A that are communicated with one first discharge port 45A and one second discharge port 47A.

Variations

Figure 15:
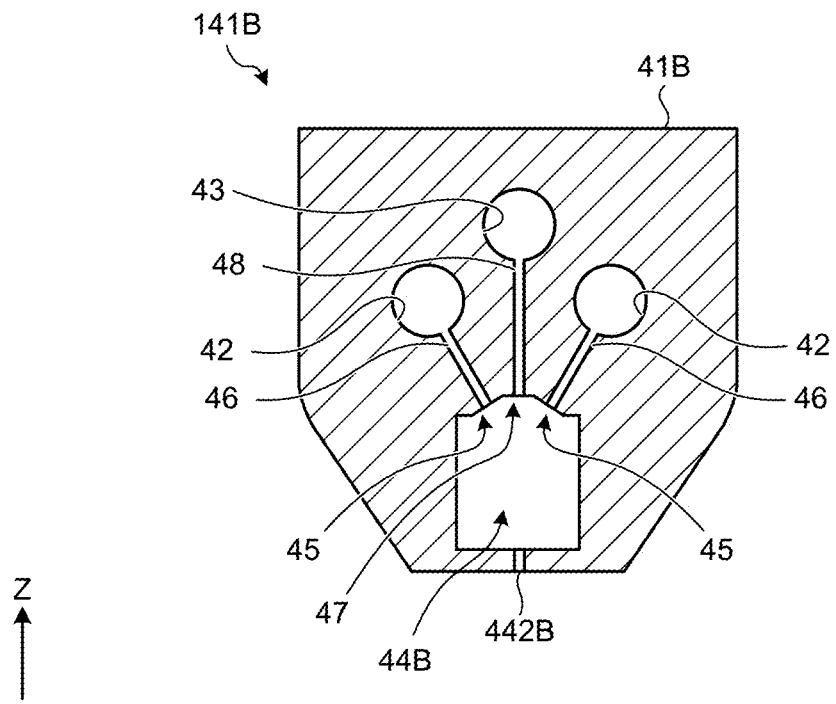
FIG. 15 is a cross-sectional view where a nozzle according to a first variation of a first embodiment is cut by a plane that is orthogonal to a longitudinal direction thereof.

FIG. 15 is a cross-sectional view where a nozzle according to a first variation of a first embodiment is cut by a plane that is orthogonal to a longitudinal direction thereof.

As illustrated in FIG. 15, a nozzle body 41B of a nozzle 141B according to a first variation includes a guiding route 44B. Whereas both ends and a lower end of the guiding route 44 of the nozzle 141 according to a first embodiment as described above in a longitudinal direction thereof are opened, both ends and a lower end of the guiding route 44B according to a first variation in a longitudinal direction thereof are closed and an injection port 442B is formed at a lower end of the guiding route 44B. A plurality of injection ports 442B are provided at a lower end of the guiding route 44B along a longitudinal direction of the nozzle 141B.

Thus, the guiding route 44B of the nozzle 141B may have the plurality of injection ports 442B.

Figure 16:
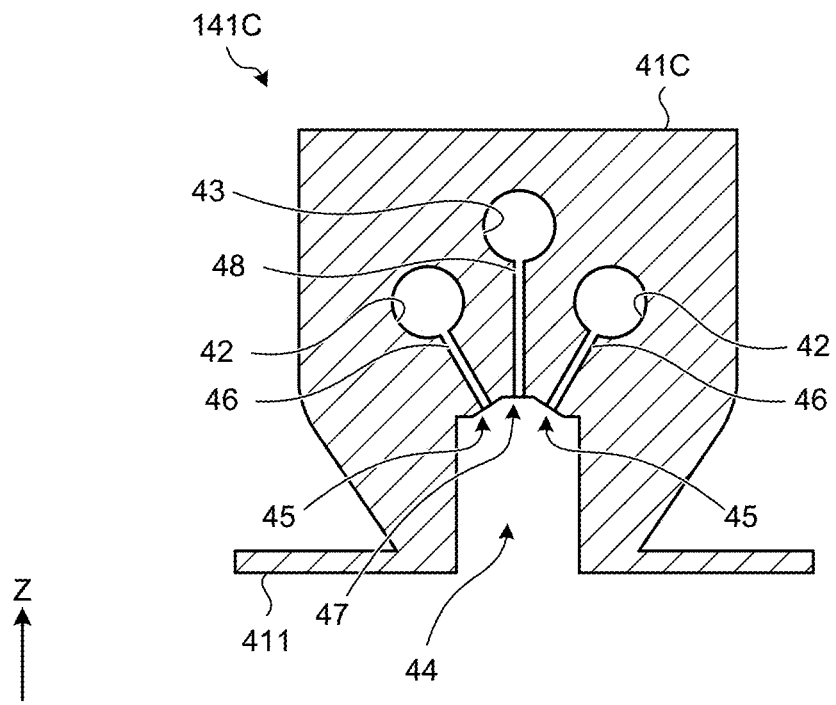
FIG. 16 is a cross-sectional view where a nozzle according to a second variation of a first embodiment is cut by a plane that is orthogonal to a longitudinal direction thereof.

FIG. 16 is a cross-sectional view where a nozzle according to a second variation of a first embodiment is cut by a plane that is orthogonal to a longitudinal direction thereof.

As illustrated in FIG. 16, a nozzle 141C according to a second variation includes a nozzle body 41C. The nozzle body 41C includes a flange part 411 that extends outward from a lower end of the nozzle body 41C, in other words, a lower end of a guiding route 44 in a horizontal direction of the nozzle body 41C. As the flange part 411 is thus provided, it is possible to retain a vapor that is discharged from the guiding route 44 near a surface of a wafer W, so that it is possible to further accelerate mixing of a vapor and an SPM liquid. Additionally, such a flange part 411 may be provided on the nozzle 141A according to a second embodiment.

Other Variations

Although an example of a case where a vapor and an SPM liquid are mixed has been explained in each of embodiments and variations as described above, a mist may be used instead of the vapor. That is, a mist supply unit that supplies a mist of pressurized purified water may be provided instead of the vapor supply unit 201.

In each of embodiments and variations as described above, a substrate processing apparatus that removes a resist film that is formed on a surface of a substrate has been provided as an example and explained. That is, an example of a case where a removal target in an SPM process is a resist film has been explained. However, a removal target in an SPM process is not limited to a resist film. For example, a removal target in an SPM process may be a residue (an organic substance) after ashing. Furthermore, a removal target in an SPM process may be an unwanted substance that is included in an abrasive after CMP (chemical mechanical polishing).

In a first embodiment as described above, a position(s) of the first discharge port(s) 45 and a position(s) of the second discharge port(s) 47 may be opposite. That is, a vapor or a mist may be discharged from a position(s) of the second discharge port(s) 47 as illustrated in FIG. 3 and an SPM liquid may be discharged from a position(s) of the first discharge port(s) 45. Furthermore, also in a second embodiment, a position(s) of the first discharge port(s) 45A and a position(s) of the second discharge port(s) 47A may be opposite similarly. That is, a vapor or a mist may be discharged from a position(s) of the second discharge port(s) 47A as illustrated in FIG. 12 and an SPM liquid may be discharged from a position(s) of the first discharge port(s) 45A.

As has been described above, a substrate processing apparatus according to an embodiment (a substrate processing apparatus 1 as an example thereof) includes a substrate holding unit (a substrate holding unit 102 as an example thereof), a fluid supply unit (a vapor supply unit 201 as an example thereof), a processing liquid supply unit (an SPM supply unit 202 as an example thereof), and a nozzle (nozzles 141, 141A to 141C as examples thereof). The substrate holding unit holds a substrate (a wafer W as an example thereof) so as to be rotatable. The fluid supply unit supplies a fluid (a vapor or a mist as an example thereof) that includes a pressurized vapor or mist of a purified water. The processing liquid supply unit supplies a processing liquid (an SPM liquid as an example thereof) that includes at least sulfuric acid. The nozzle is connected to the fluid supply unit and the processing liquid supply unit, mixes a fluid and a processing liquid, and discharge it to a substrate. Furthermore, the nozzle includes a first discharge port (first discharge ports 45, 45A as examples thereof), a second discharge port (second discharge ports 47, 47A as examples thereof), and a guiding route (guiding routes 44, 44A, 44B as examples thereof). The first discharge port discharges a fluid that is supplied from the fluid supply unit. The second discharge port discharges a processing liquid that is supplied from the processing liquid supply unit. The guiding route is communicated with the first discharge port and the second discharge port and guides a mixed fluid of a fluid that is discharged from the first discharge port and a processing liquid that is discharged from the second discharge port. Furthermore, a cross-sectional area of the guiding route is greater than a cross-sectional area of the first discharge port.

It is possible for a substrate processing apparatus according to an embodiment to prevent or reduce diffusion of a fluid that is discharged from a first discharge port by a guiding route. Thereby, it is possible to mix a fluid and an SPM liquid efficiently, and it is possible to raise a temperature of an SPM liquid efficiently. Therefore, it is possible for a substrate processing apparatus according to an embodiment to improve removal efficiency of a removal target in an SPM process.

The nozzle (nozzles 141, 141B, 141C as examples thereof) may include a plurality of the first discharge ports (the first discharge port 45 as an example thereof) and a plurality of the second discharge ports (the second discharge port 47 as an example thereof). Furthermore, the nozzle may include the one guiding route (the guiding route 44 as an example thereof) that is communicated with a plurality of the first discharge ports and a plurality of the second discharge ports.

The nozzle (the nozzle 141A as an example thereof) may include a plurality of the first discharge ports (the first discharge port 45A as an example thereof) and a plurality of the second discharge ports (the second discharge port 47A as an example thereof). Furthermore, the nozzle may include a plurality of the guiding routes (the guiding route 44A as an example thereof) that are communicated with the one first discharge port and the one second discharge port.

The guiding route (the guiding routes 44A, 44B as examples thereof) may include a plurality of injection ports (injection ports 442, 442B as examples thereof) at a lower end thereof. In such a case, a cross-sectional area of the injection port may be less than a cross-sectional area of the guiding route. Thereby, even in a case where a liquid drop of an SPM liquid is significantly grown while moving along an inner wall of a guiding route, it passes through an injection port, so that it is possible to atomize a liquid drop so as to have a sufficiently small particle diameter and inject it.

The substrate processing apparatus according to an embodiment may include an auxiliary nozzle (an auxiliary nozzle 151 as an example thereof) that is provided separately from the nozzle and discharges a fluid to a substrate. As an auxiliary nozzle is used, it is possible to supply a vapor to a whole surface of a substrate more uniformly. Therefore, it is possible to raise a temperature of an SPM liquid over a whole surface of a substrate more uniformly.

The substrate processing apparatus according to an embodiment may include a nozzle moving unit (a first arm 142 as an example thereof) that moves the nozzle between a processing position above the substrate holding unit and a waiting position outside the substrate holding unit. Furthermore, the substrate processing apparatus may include a cleaning mechanism (a nozzle cleaning mechanism 106 as an example thereof) that is arranged at the waiting position and cleans the nozzle. As a nozzle cleaning mechanism is included, it is possible to remove an SPM liquid that is attached to a nozzle 141.

The cleaning mechanism may include a cleaning tank (a cleaning tank 161 as an example thereof) that houses the nozzle, a cleaning liquid discharge unit (a cleaning liquid discharge port 163 as an example thereof) that discharges a cleaning liquid to an inside of the cleaning tank, and a dew removing member (a dew removing member 165 as an example thereof) that is arranged inside the cleaning tank. The dew removing member moves a liquid drop of a cleaning liquid that is interposed between the nozzle and the dew removing member and contacts both the nozzle and the dew removing member, from the nozzle to the dew removing member. Thereby, it is possible to dry a nozzle without using, for example, a gas such as $N_2$.

A hydrophilicity of the dew removing member is higher than that of the nozzle. Thereby, it is possible to move a cleaning liquid that is attached to a nozzle to a dew removing member appropriately.

According to the present disclosure, it is possible to improve removal efficiency of a removal target in a liquid process.

It should be considered that an embodiment(s) as disclosed herein is/are not limitative but is/are illustrative in all aspects thereof. In fact, it is possible to implement an embodiment(s) as described above in a variety of forms. Furthermore, an embodiment(s) as described above may be omitted, substituted, or modified in a variety of forms without departing from the appended claim(s) and an essence thereof.

What is claimed is:

1. A substrate processing apparatus, comprising:
   a substrate holding unit that holds a substrate to be rotatable;
   a fluid supply that supplies a fluid that includes a pressurized vapor or mist of a purified water;
   a processing liquid supply that supplies a processing liquid that includes at least sulfuric acid; and
   a nozzle that is connected to the fluid supply and the processing liquid supply, mixes the fluid and the processing liquid into a mixed fluid, and discharges the mixed fluid to the substrate, the nozzle including:
      a plurality of first discharge ports that discharge the fluid that is supplied from the fluid supply;
      a plurality of second discharge ports that discharge the processing liquid that is supplied from the processing liquid supply; and
      one guiding route that is communicated with the plurality of a first discharge ports and the plurality of second discharge ports and guides the mixed fluid of the fluid that is discharged from the plurality of first discharge ports and the processing liquid that is discharged from the plurality of second discharge ports, wherein
   a cross-sectional area of the guiding route is greater than a cross-sectional area of the plurality of first discharge ports.

2. The substrate processing apparatus according to claim 1, wherein
   the one guiding route includes a plurality of injection ports at a lower end thereof, and
   a cross-sectional area of each of the plurality of injection ports is less than a cross-sectional area of the one guiding route.

3. The substrate processing apparatus according to claim 1, further comprising an auxiliary nozzle that is provided separately from the nozzle and discharges the fluid to the substrate.

4. The substrate processing apparatus according to claim 1, further comprising:
   a nozzle moving unit that moves the nozzle between a processing position above the substrate holding unit and a waiting position outside the substrate holding unit; and
   a cleaning mechanism that is arranged at the waiting position and cleans the nozzle.

5. The substrate processing apparatus according to claim 1, wherein the processing liquid is an SPM liquid that is a mixed liquid of sulfuric acid and a hydrogen peroxide solution.

6. The substrate processing apparatus according to claim 1, wherein the plurality of first discharge ports and the plurality of second discharge ports are arrayed along a longitudinal direction of the nozzle.

7. A substrate processing apparatus, comprising:
   a substrate holding unit that holds a substrate to be rotatable;
   a fluid supply that supplies a fluid that includes a pressurized vapor or mist of a purified water;
   a processing liquid supply that supplies a processing liquid that includes at least sulfuric acid; and
   a nozzle that is connected to the fluid supply and the processing liquid supply, mixes the fluid and the processing liquid into a mixed fluid, and discharges the mixed fluid to the substrate, the nozzle including:
      a plurality of first discharge ports that discharge the fluid that is supplied from the fluid supply;
      a plurality of second discharge ports that discharge the processing liquid that is supplied from the processing liquid supply; and
      a plurality of guiding routes, wherein
   each guiding route of the plurality of guiding routes is communicated with one of the plurality of first discharge ports and one of the plurality of second discharge ports and guides the mixed fluid of the fluid that is discharged from the plurality of first discharge ports and the processing liquid that is discharged from the plurality of second discharge ports, and
   a cross-sectional area of the plurality of guiding routes is greater than a cross-sectional area of the plurality of first discharge ports.

8. The substrate processing apparatus according to claim 7, wherein
   the plurality of guiding routes include a plurality of injection ports at a lower end thereof, and
   a cross-sectional area of each of the plurality of injection ports is less than a cross-sectional area of the plurality of guiding routes.

9. The substrate processing apparatus according to claim 7, further comprising an auxiliary nozzle that is provided separately from the nozzle and discharges the fluid to the substrate.

10. The substrate processing apparatus according to claim 7, wherein the processing liquid is an SPM liquid that is a mixed liquid of sulfuric acid and a hydrogen peroxide solution.

11. A substrate processing apparatus, comprising:
a substrate holding unit that holds a substrate to be rotatable;
a fluid supply that supplies a fluid that includes a pressurized vapor or mist of a purified water;
a processing liquid supply that supplies a processing liquid that includes at least sulfuric acid;
a nozzle that is connected to the fluid supply and the processing liquid supply, mixes the fluid and the processing liquid into a mixed fluid, and discharges the mixed fluid to the substrate, the nozzle including:
at least one first discharge port that discharges the fluid that is supplied from the fluid supply;
at least one second discharge port that discharges the processing liquid that is supplied from the processing liquid supply; and
at least one guiding route that is communicated with the at least one first discharge port and the at least one second discharge port and guides the mixed fluid of the fluid that is discharged from the at least one first discharge port and the processing liquid that is discharged from the at least one second discharge port, wherein
a cross-sectional area of the at least one guiding route is greater than a cross-sectional area of the at least one first discharge port;
a nozzle moving unit that moves the nozzle between a processing position above the substrate holding unit and a waiting position outside the substrate holding unit; and
a cleaning mechanism that is arranged at the waiting position and cleans the nozzle, the cleaning mechanism including:
a cleaning tank that houses the nozzle;
a cleaning liquid discharge unit that discharges a cleaning liquid to an inside of the cleaning tank; and
a dew removing member that is arranged inside the cleaning tank, wherein
the dew removing member moves a liquid drop, of the cleaning liquid that is interposed between the nozzle and the dew removing member and contacts both the nozzle and the dew removing member, from the nozzle to the dew removing member.

12. The substrate processing apparatus according to claim 11, wherein a hydrophilicity of the dew removing member is higher than that of the nozzle.

13. The substrate processing apparatus according to claim 11, wherein
the at least one guiding route includes a plurality of injection ports at a lower end thereof, and
a cross-sectional area of each of the plurality of injection ports is less than a cross-sectional area of the at least one guiding route.

14. The substrate processing apparatus according to claim 11, further comprising an auxiliary nozzle that is provided separately from the nozzle and discharges the fluid to the substrate.

15. The substrate processing apparatus according to claim 11, wherein the processing liquid is an SPM liquid that is a mixed liquid of sulfuric acid and a hydrogen peroxide solution.

* * * * *